US006996016B2

(12) United States Patent
Oh (10) Patent No.: US 6,996,016 B2
(45) Date of Patent: Feb. 7, 2006

(54) ECHO CLOCK ON MEMORY SYSTEM HAVING WAIT INFORMATION

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 10/675,549

(22) Filed: Sep. 30, 2003

(65) Prior Publication Data

US 2005/0068812 A1    Mar. 31, 2005

(51) Int. Cl.
*G11C 7/00* (2006.01)
(52) U.S. Cl. .................... 365/193; 365/191; 365/233
(58) Field of Classification Search .......... 365/189.01, 365/189.11, 191, 193 O, 233, 222
See application file for complete search history.

(56) References Cited

U.S. PATENT DOCUMENTS

| 6,466,496 | B2 * | 10/2002 | Kuge ........................ 365/201 |
| 6,504,789 | B2 * | 1/2003 | Hirakawa ................... 365/233 |
| 6,603,706 | B1 * | 8/2003 | Nystuen et al. ............. 365/233 |
| 6,681,301 | B1 * | 1/2004 | Mehta et al. ............... 365/233 |
| 2004/0022095 | A1 * | 2/2004 | Lee ............................. 365/200 |
| 2004/0047227 | A1 * | 3/2004 | Jakobs ....................... 365/232 |

FOREIGN PATENT DOCUMENTS

EP    0 344 886 A1    12/1989

OTHER PUBLICATIONS

PCT International Search Report and Written Opinion dated Jun. 8, 2005.
*General DDR SDRAM Functionality*, Micron Technical Note TN 46-05, Micron Technology, Inc., Jul. 2001, pp. 1-11.
*KDM432D2131—64 Mbit DDR SGRAM, 512K×32Bit×4 Banks, Double Data Rate Synchronous Graphic RAM with Bi-directional Data Strobe*, Samsung Electronics Target Specification, Revision 0.3, May 1999, pp. 1-49.
C. H. Kim et al., *A 64-Mbit, 640-MByte/s Bidirectional Data Strobed, Double-Data-Rate SDRAM with a 40-mW DLL for a 256-Mbyte Memory System*, IEEE Journal of Solid-State Circuits, vol. 33, No. 11, pp. 1703-1709, Nov. 1998.

* cited by examiner

*Primary Examiner*—VanThu Nguyen
(74) *Attorney, Agent, or Firm*—Patterson & Sheridan, L.L.P.

(57) ABSTRACT

A method and a circuit configuration for implementing a double data rate feature in a memory device capable of operating in a variable latency mode. The memory device may utilize a WAIT_DQS signal that combines functionality of a WAIT signal indicating when valid data is present on a data bus in Read cycle and the memory is ready to accept data in Write cycle, and a data strobe (DQS) signal.

40 Claims, 10 Drawing Sheets

ECHO CLOCK ON MEMORY SYSTEM HAVING WAIT INFORMATION

BACKGROUND OF THE INVENTION

1. Field of the Invention

The present invention generally relates to integrated circuit memory devices and, more particularly, to Pseudo Static random access memory (PSRAM) devices operating in a burst access mode ("burst PSRAM").

2. Description of the Related Art

In portable applications, such as handheld/wireless devices, the use of low power consuming memory is essential. A PSRAM device meets both low power consumption and high density requirements. A PSRAM, like a conventional dynamic random access memory (DRAM), contains dynamic memory cells but, in terms of interface and packaging, has the appearance of a static random access memory (SRAM). In the PSRAM, a refresh operation that is commonly required to maintain the stored information in dynamic memory cells is facilitated using internal means and, as such, is transparent to a system controller of the memory. Further, a PSRAM may operate in a burst mode. The burst mode enhances the speed of storing and retrieving information (or "data"). In the burst mode, specific functions must occur in a predetermined sequence. Such functions are generally performed in response to command signals produced by a system controller of the PSRAM device. The timing of the command signals is determined by a clock signal (CLK) and is registered either to an edge of the clock signal or occurring a predetermined time after the edge. To further increase data transmission rates, the PSRAM device may operate in a burst mode when an internal address counter increments an initial address to produce serial column locations. Additionally, in the burst mode, the burst PSRAM device may operate in fixed and variable latency modes where a value of the latency determines a minimal number of clock cycles that pass before a valid data output is present on a data bus.

In a single data-rate (SDR) burst PSRAM device, either a rising edge or a falling edge of the clock signal may be used as a data trigger point for the read and write operations. Herein, such operations are illustratively synchronized with the rising edge of the clock signal. Obtaining a high data transmission rate requires increasing the clock frequency or expanding a width of a system bus of the burst PSRAM device. In a fixed latency mode, burst PSRAM produces the valid data always in the programmed latency regardless of the internal condition of the device. In a variable latency mode, the burst PSRAM devices use a WAIT signal indicating to the system controller when valid data is present on a data bus in a Read cycle and when the memory is ready to accept data in a Write cycle. In the event that a Read or Write cycle collides with the execution of an internal refresh operation, the burst PSRAM asserts a few clock cycles of WAIT states until completion of the refresh operation. Otherwise, the read or write access would take place in the fastest time. The WAIT signal allows the data output and data input functions to take place at optimal time and, as such, increase operational speed of the burst PSRAM device.

Figure 8:
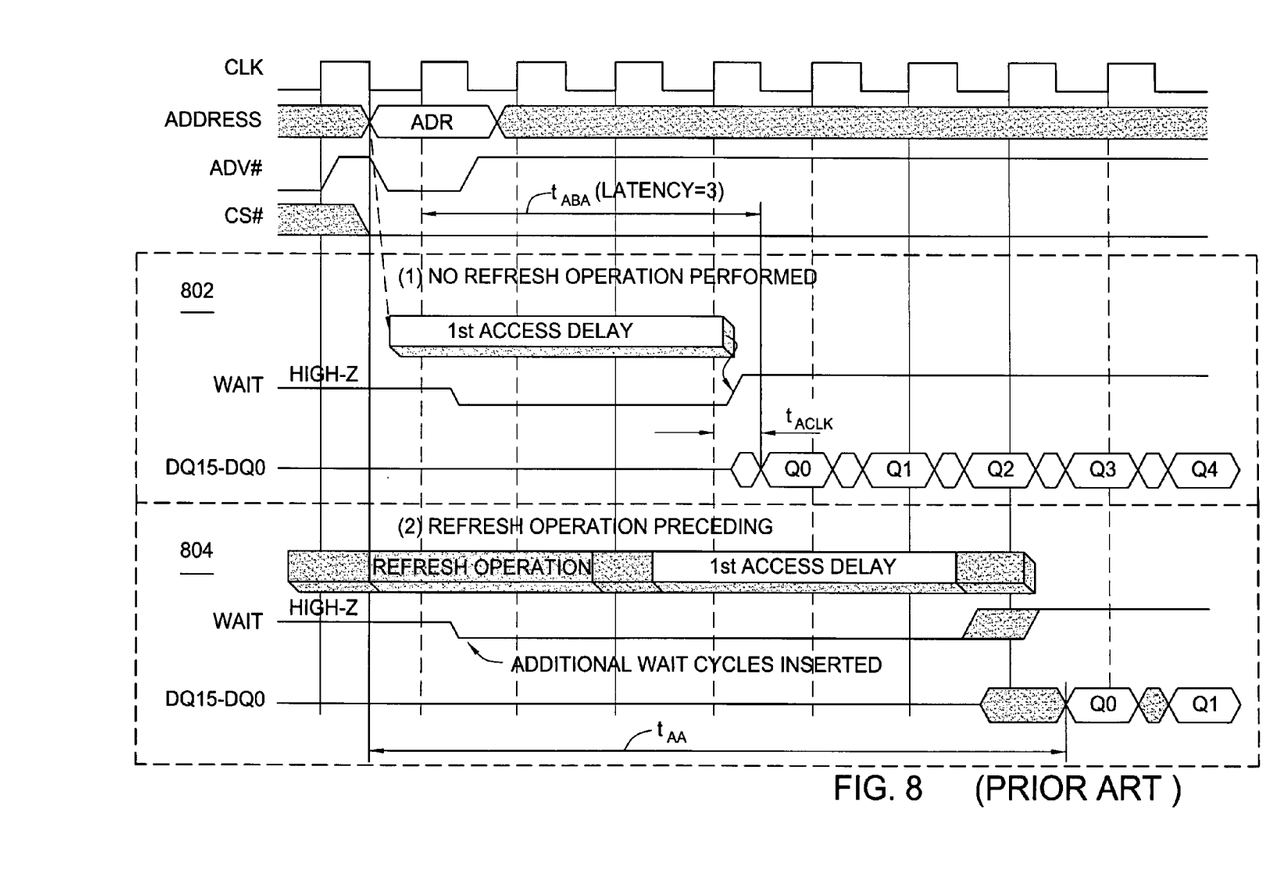
FIG. 8 depicts a series of illustrative timing diagrams of signals which might appear in Read cycle on corresponding transmission lines of system and data buses of a SDR burst PSRAM device operating in a variable latency mode.

FIG. 8 depicts a series of illustrative timing diagrams of signals which might appear in Read cycle on corresponding transmission lines of system and data buses of the SDR burst PSRAM device operating in a variable latency mode. In FIG. 8, the latency is illustratively equal to 3 clock cycles. Sub-series 802 and 804 include traces of the CLK signal, an Address signal, an Address Valid (ADV) signal, and a Chip Select (CS) signal and relate to a regular Read cycle and the Read cycle performed after the refresh operation, respectively.

In a double data rate (DDR) SDRAM device, both the rising and falling edges of the clock signal are trigger points for read and write operations. The DDR DRAM device doubles the peak data rate of comparable single data rate (SDR) SDRAM device using the same clock frequency. To address the increased timing accuracy requirements, a differential clock scheme is used in the DDR SDRAM devices. The DDR SDRAM uses a DQS signal which switching phase is edge-aligned with data output in Read cycles and center-aligned with data input in Write cycles to serve as a timing signal for valid data.

Figure 9:
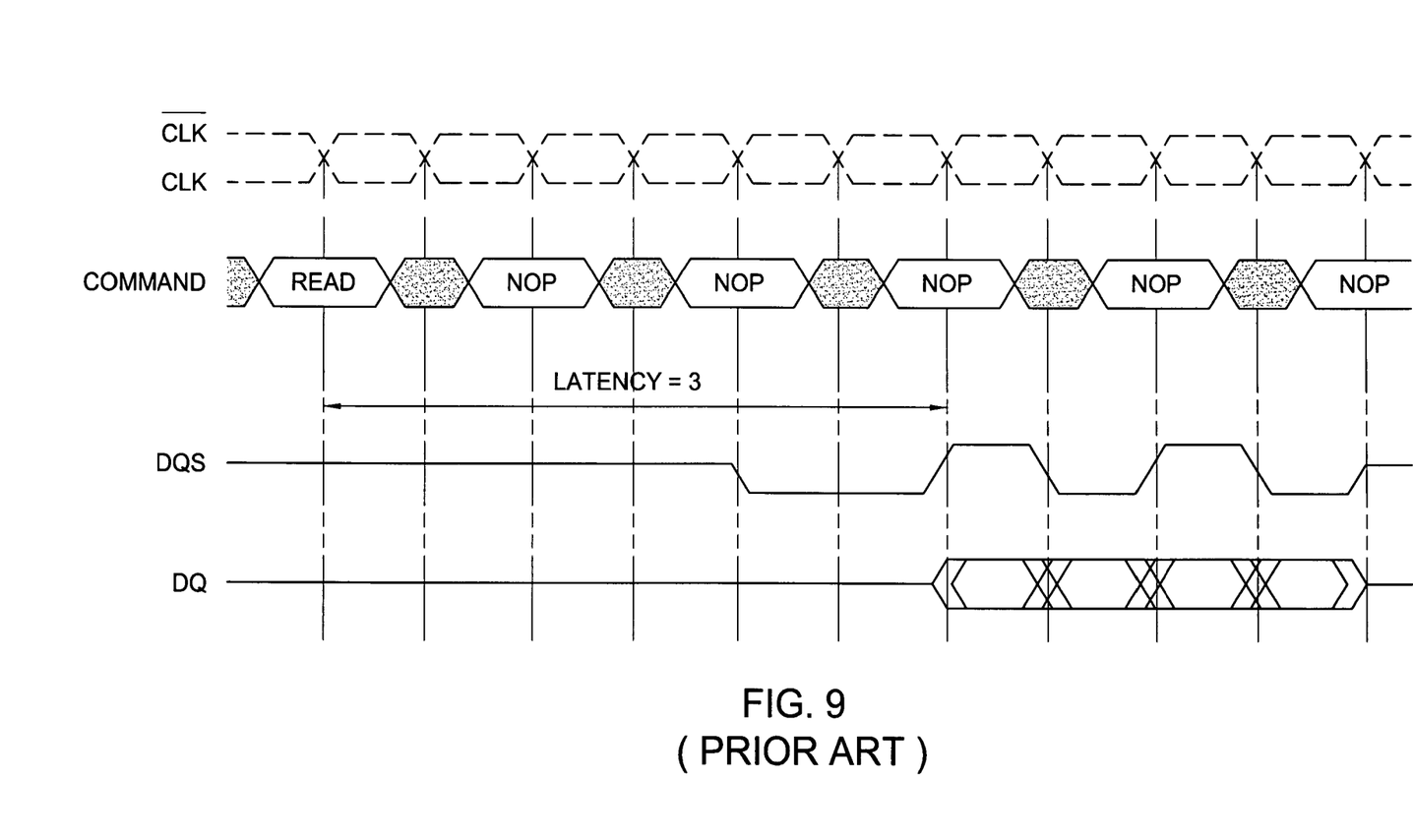
FIG. 9 depicts a series of illustrative timing diagrams of signals which might appear in Read cycle on corresponding transmission lines of system and data buses of a DDR SDRAM device operating in a fixed latency mode.
Figure 10:
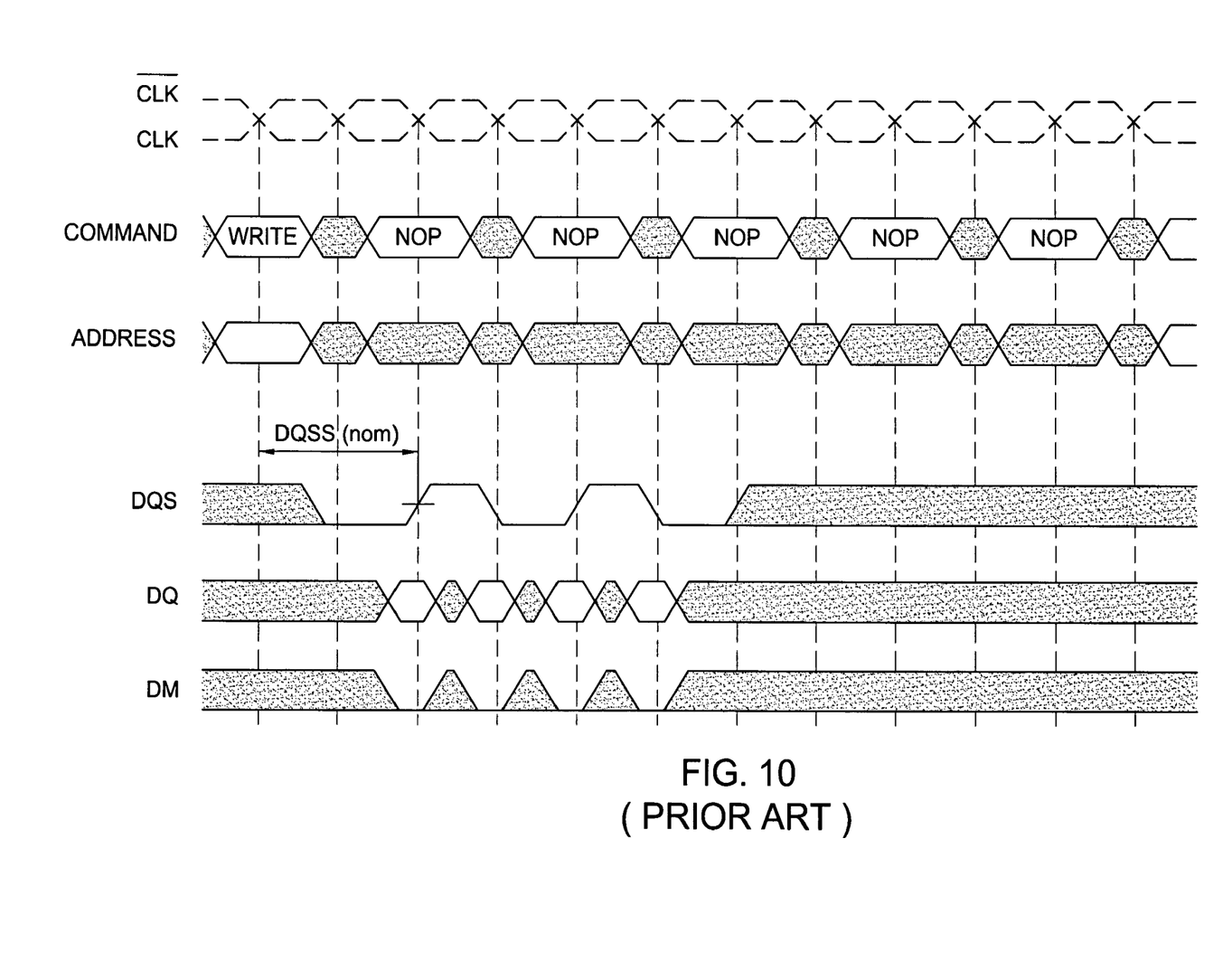
FIG. 10 depicts a series of illustrative timing diagrams of signals which might appear in Write cycle on corresponding transmission lines of system and data buses of a DDR SDRAM device operating in a fixed latency mode.

FIGS. 9 and 10 depict a series of illustrative timing diagrams of signals which might appear in Read and Write cycles, respectively, on corresponding transmission lines of system and data buses of a DDR SDRAM device operating in a fixed latency mode. In FIGS. 9 and 10, the latency is exemplary equal to 3 clock cycles, complimentary clock signal is shown with broken lines, and NOP, $t_{DQSS(nom)}$ and DM correspond to "no operation", respectively. The rising and falling edges of the DQS signal are aligned to the edge of data outputs in Read cycle and to the center of the data inputs in Write cycle, respectively. Before the first valid data inputs or outputs, as well as after the last data inputs or outputs, the DQS signal asserts a logic low state and prepares buffers in the memory or system controller for receiving the data.

To facilitate a DDR feature in a memory device that is capable of operating in a variable latency mode by using the WAIT signal, such as PSRAM, the memory device needs the signal that may assert functionality of the DQS signal. However, an addition of the DQS signal increases the pin count of the memory and system controller and a width of the system bus, as well as may compromise timing relationship between the data strobe signal and the data.

Therefore, there is a need in the art for an improved method and circuit configuration for implementing a double data rate feature in a memory device capable of operating in a variable latency mode, such as a burst PSRAM device.

SUMMARY OF THE INVENTION

A method of operating a double data rate (DDR) burst PSRAM memory device in a variable latency mode in Read cycle and a fixed latency mode in Write cycle or in the variable latency mode in both Read and Write cycles. The method uses a WAIT_DQS signal that combines functions of a data strobe (DQS) signal and a WAIT signal that indicates to a system controller of the DDR burst PSRAM memory device when valid data is present on a data bus in Read cycle and when memory is ready to accept data in Write cycle.

In one embodiment of the method, the WAIT_DQS signal is initiated by the memory in Read cycle of a variable latency mode and by the system controller in Write cycle of a fixed latency mode.

In another embodiment of the method, in Write cycle of a variable latency mode, the memory and system controller sequentially initiate the WAIT_DQS signal.

In yet another embodiment, a circuit configuration for operating a DDR burst PSRAM memory device comprises a memory, a system controller, a data bus and a system bus between the memory and system controller, wherein the system bus comprises a bi-directional line that transmits a WAIT_DQS signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention generally provides methods and circuit configurations for implementing a double data rate feature in memory devices capable of operating in a variable latency mode in Read and/or Write cycles, such as burst PSRAM devices.

Figure 1:
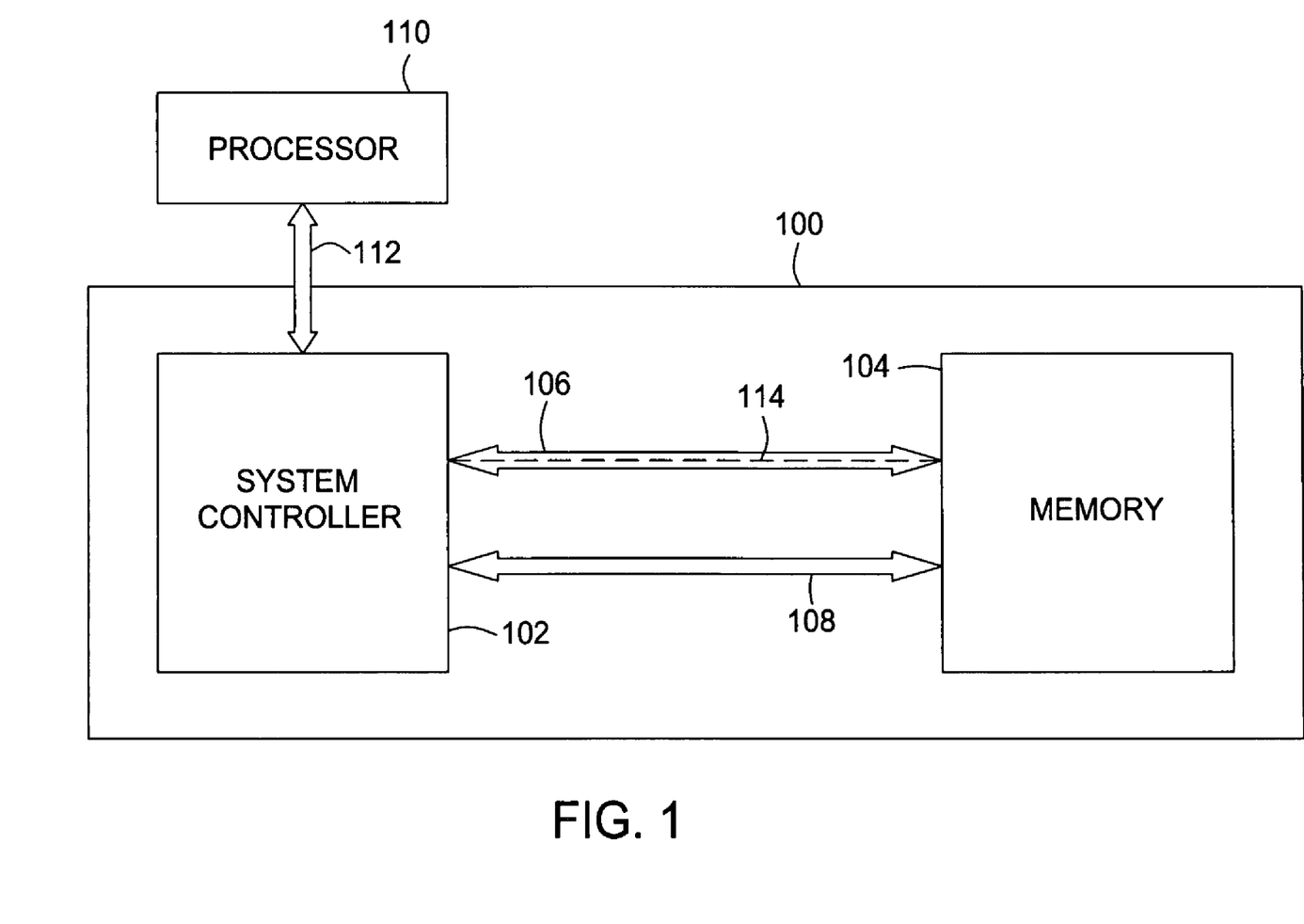
FIG. 1 depicts a simplified functional block diagram of a DDR Burst PSRAM device in accordance with one embodiment of the present invention.

FIG. 1 depicts a simplified functional block diagram of a system 100 using a burst PSRAM device 104. In one embodiment, the system 100 generally comprises a system controller 102, a memory 104, an address/command (i.e., system) bus 106, and a data (i.e., DQ) bus 108. The memory 104 may comprise one or more component memories (discussed below in reference to FIG. 2), where each component memory is coupled to the buses 106 and 108. The system bus 106 may comprise unidirectional and bi-directional transmission lines, while the DQ bus includes bi-directional transmission lines. The system controller 102 is typically coupled to a processor of an external electronic device 110 (e.g., computer, cell phone, and the like) using an application-specific interface 112.

In one embodiment of the invention, the system bus 106 comprises a bi-directional line 114 (shown in phantom) that transmits a WAIT_DQS signal and a plurality unidirectional transmission lines propagating conventional control and command signals. Such conventional control and command signals comprise, among other such signals, a Clock (CLK) signal, an Address (e.g., 21-bit address word A20–A0) signal, an Address Valid (ADV) signal, a Write Enable (WE) signal, and a Chip Select (CS) signal (all discussed below in reference to FIGS. 3–7).

In one embodiment, the WAIT_DQS signal is a 3-state digital signal that combines functions of a WAIT signal and a data strobe (DQS) signal. In the burst memory devices, the WAIT signal is used to indicate to the system controller 102 when valid data is present on the DQ bus 108 in Read cycle and when the memory 104 is ready to accept data from the DQ bus 108 in Write cycle. Correspondingly, the DQS signal is used in the double data rate (DDR) SDRAM devices in Read and Write cycles to serve as a timing signal for valid data on the DQ bus 108. In the present invention, the WAIT and DQS signals are disabled or not provided to the system bus 106.

To reduce a width (i.e., number of transmission lines) of the system bus 106, the bi-directional line 114 may replace the line that otherwise may be used to transmit the WAIT signal. The bi-directional line 114 may replace the lines transmitting the WAIT signal and the lines transmitting the DQS signal.

In one embodiment, loading conditions of the bi-directional line 114 are selected to match the loading conditions of the DQ bus 108 and, in operation, facilitate matched timing relationship between the WAIT_DQS signal and data. When the WAIT_DQS signal is transmitted using a transmitting line that initially was designed to transmit the WAIT signal, no modification in loading conditions may be required for that transmitting line.

Figure 2:
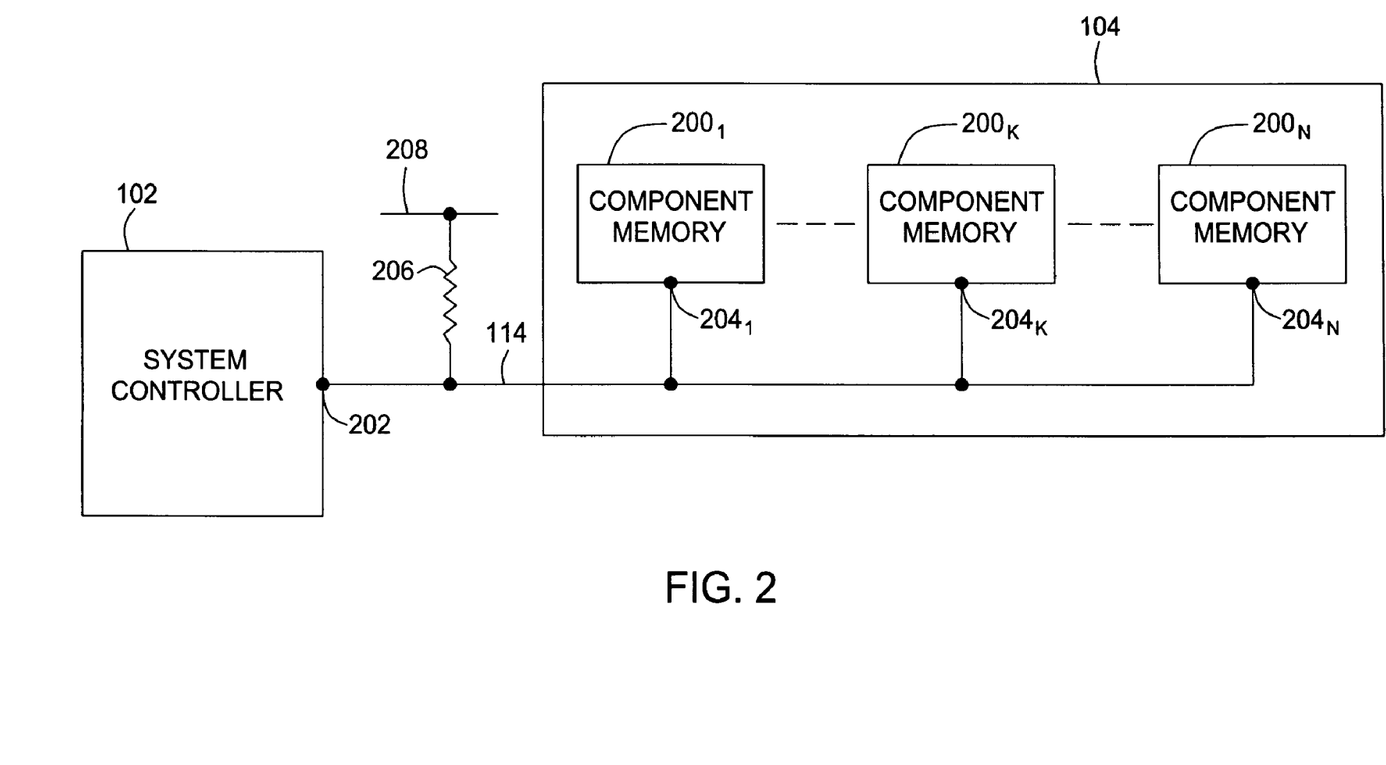
FIG. 2 depicts a portion of a system bus of the DDR Burst PSRAM device of FIG. 1.

FIG. 2 depicts a portion of the system bus 106 of the system 100 where the memory 104 illustratively comprises a plurality of component memories 200. In FIG. 2, individual component memories are identified using the same reference numeral, except that the suffix "K", where K is an integer from 1 to N, has been added to differentiate between the component memories. The bi-directional line 114 is coupled to terminals 202 and $204_K$ of the system controller 102 and component memories $200_K$, respectively. In one exemplary embodiment, the bi-directional line 114 also provides a wired logic-OR connection between the system controller 102 and component memories $200_K$. Illustratively, such a wired logic-OR connection may be facilitated using a pull-up resistor 206 that is coupled to a power line 208 of the system 100. In a further exemplary embodiment, the terminals 202 and $204_K$ may replace terminals of the disabled or not provided WAIT and DQS signals.

FIGS. 3–7 depict a series of illustrative timing diagrams of signals which might appear on corresponding transmission lines of the system bus 106 and data bus 108 of the DDR SDRAM device of FIG. 1 in Read cycle of a variable latency mode and in Write cycle of fixed and variable latency modes. For illustrative purposes, the same conventional timing relationships between the clock (CLK), Address (A20–A0), Address Valid (ADV#), Write Enable (WE#), and Chip Select (CS#) signals (graphs 1, 2, 3, 4, and 5, respectively) are shown in FIGS. 3–7. Herein the sign "#" indicates that, in active state, a signal asserts a logic low state. The ADV#, WE#, and CS# signals assert for one clock cycle an active (i.e., logic low) state with an Address (Ai) has been provided on the system bus 106. The CS# signal returns to an inactive (i.e., logic high) state one-half clock cycle from an end of the data burst. In the depicted embodiments, an exemplary burst length is 4, the latency (LAT) in Read and Write cycles of both fixed and variable modes is 2. The Address (Ai) is timed by ADV# and CS# signals, asserted during a first clock cycle, and ignored thereafter in the cycle (i.e., Read or Write cycle). Address (A20–A0) and data (DQ15–DQ0) signals appear on exemplary 21-bit address portion of the system bus 106 and the exemplary 16-bit DQ bus 108, respectively. Valid data signals illustratively comprise a sequence (i.e., burst) of 4 data outputs (Read cycle) or data inputs (Write cycle) D0–D3 (graph 7) which are sampled using the WAIT_DQS signal (graph 6). In alternate embodiments, burst length and latency may be each either greater or smaller than in the depicted embodiments, as well as the burst length and latency may be different for Read cycles and Write cycles. In FIGS. 3–7, the x-axes and y-axes of the respective graphs 1–7 are conventionally not shown.

Figure 3:
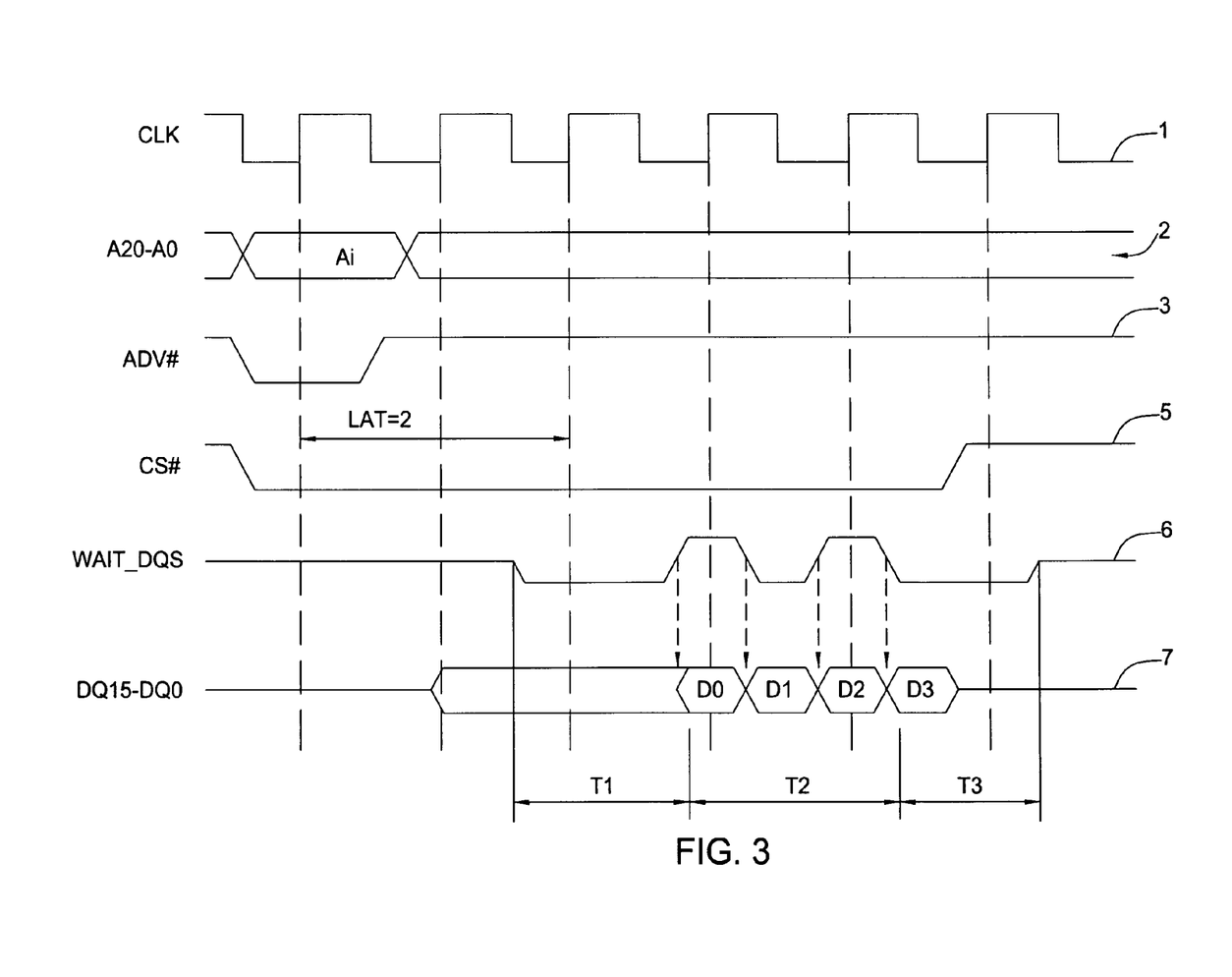
FIG. 3 depicts a series of illustrative timing diagrams of signals which might appear on corresponding transmission lines of system and data buses of the DDR Burst PSRAM device of FIG. 1 in Read cycle of a variable latency mode.

FIG. 3 depicts a series of illustrative timing diagrams of signals which might appear on corresponding transmission lines of the system bus 106 and data bus 108 of the DDR burst PSRAM device of FIG. 1 that, in Read cycle, operates in a variable latency mode. Specifically, FIG. 3 depicts the CLK, A20–A0, ADV#, CS#, WAIT_DQS, and DQ15–DQ0 signals (graphs 1–3, 5–7, respectively) versus time. The WE# signal asserts logic high in Read cycle and, as such, not shown. The WAIT_DQS signal is initiated (i.e., driven) by the memory 104 or one of the component memories (e.g., component memory $200_K$) and comprises a preamble period T(1), a data validation period T(2), and a postamble period T(3). Prior to the preamble period T(1), the WAIT_DQS signal asserts a high-impedance state. During the preamble period T(1), the WAIT_DQS signal asserts logic low for a duration of one clock cycle on a clock signal that precedes the clock signal when the latency LAT elapses or the memory is ready to output the first valid data output D0. The logic low level of the WAIT_DQS signal indicates to the system controller 102 that valid data outputs D0–D3 are coming. Then, during the following data validation period T(2), the WAIT_DQS signal is edge-aligned to data output and toggles between logic low and logic high at every phase of data outputs to enable the system controller 102 to strobe valid data. Finally, during the postamble period T(3), the WAIT_DQS signal asserts logic low for a duration of one clock cycle following the output of last valid data D3 and then goes back into the high-impedance state through the remainder of the Read cycle. Since the burst PSRAM operates in the variable latency mode, the time (i.e., clock cycle) when the first valid data may appear on the data bus may be delayed from the given latency, depending on the internal situation of the burst PSRAM device, such as, e.g., a refresh operation.

Figure 4:
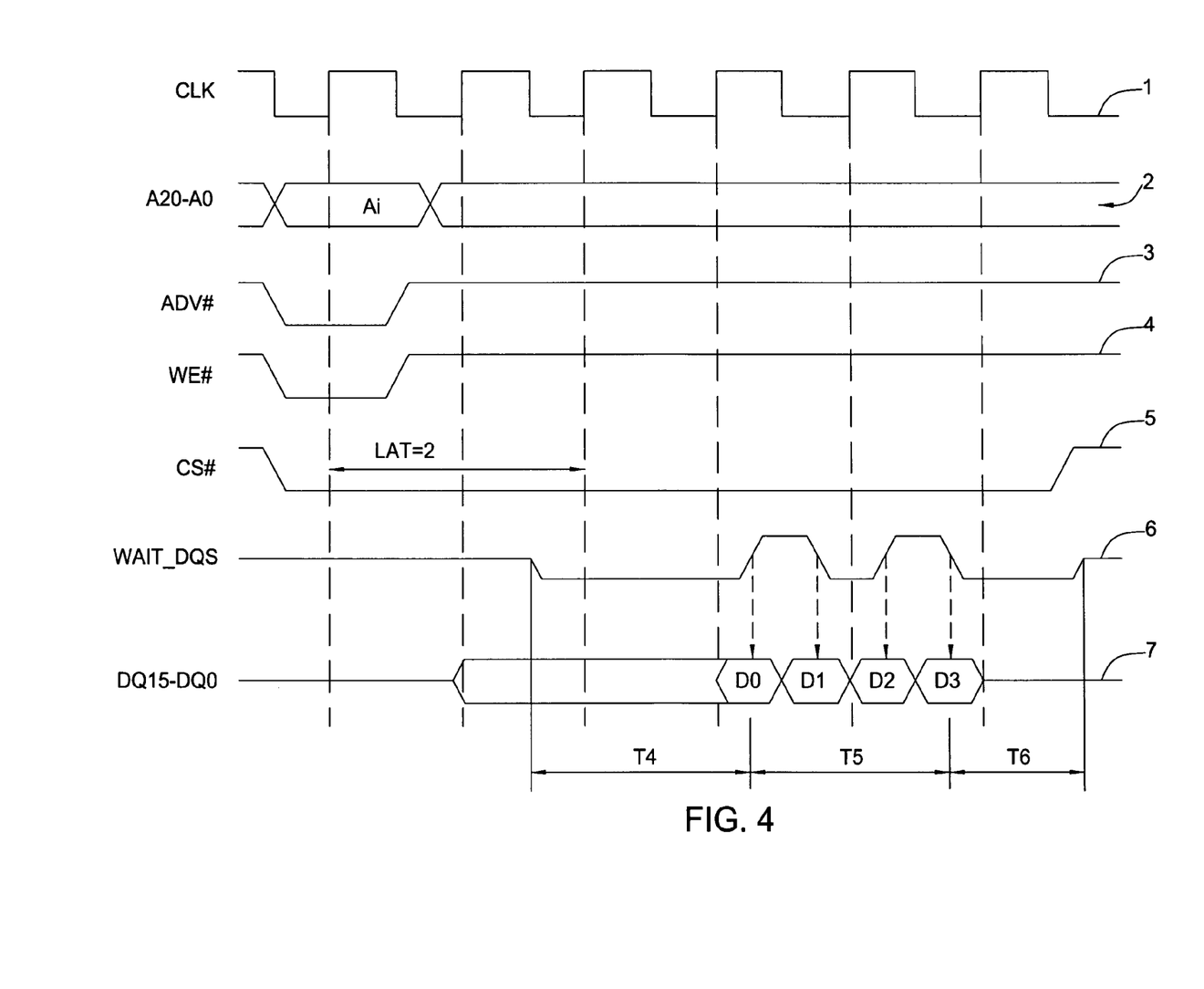
FIG. 4 depicts a series of illustrative timing diagrams of signals which might appear on corresponding transmission lines of system and data buses of the DDR Burst PSRAM device of FIG. 1 in Write cycle of a fixed latency mode.

FIG. 4 depicts a series of illustrative timing diagrams of signals which might appear on corresponding transmission lines of the system bus 106 and data bus 108 of the DDR burst PSRAM device of FIG. 1 that, in Write cycle, operates in a fixed latency mode. In the fixed latency mode, the first data input D0 is always needed at the same time after a burst command regardless of internal state of the memory 104. Specifically, FIG. 4 depicts the CLK, A20–A0, ADV#, WE#, CS#, WAIT_DQS, and DQ15–DQ0 signals (graphs 1–7, respectively) versus time. The WAIT_DQS signal is initiated by the system controller 102 and comprises a preamble period T(4), a data validation period T(5), and a postamble period T(6). Prior to the preamble period T(4), the WAIT_DQS signal stays in the high-impedance state. During the preamble period T(4), the WAIT_DQS signal asserts logic low on a clock signal that precedes the clock signal when the latency LAT elapses or the memory is ready to ready to first valid data input D0. The low level of the WAIT_DQS signal prepares the memory 102 (or component memory $200_K$) to data inputs D0–D3. Then, during the following data validation period T(5), the WAIT_DQS signal is center-aligned to data inputs and toggles between logic low and logic high to enable the memory 104 (or component memory $200_K$) to strobe valid input data. Finally, during the postamble period T(6), the WAIT_DQS signal asserts logic low for a duration of one clock cycle following the input of last valid data D3, and then asserts logic high through the remainder of the Write cycle.

Figure 5:
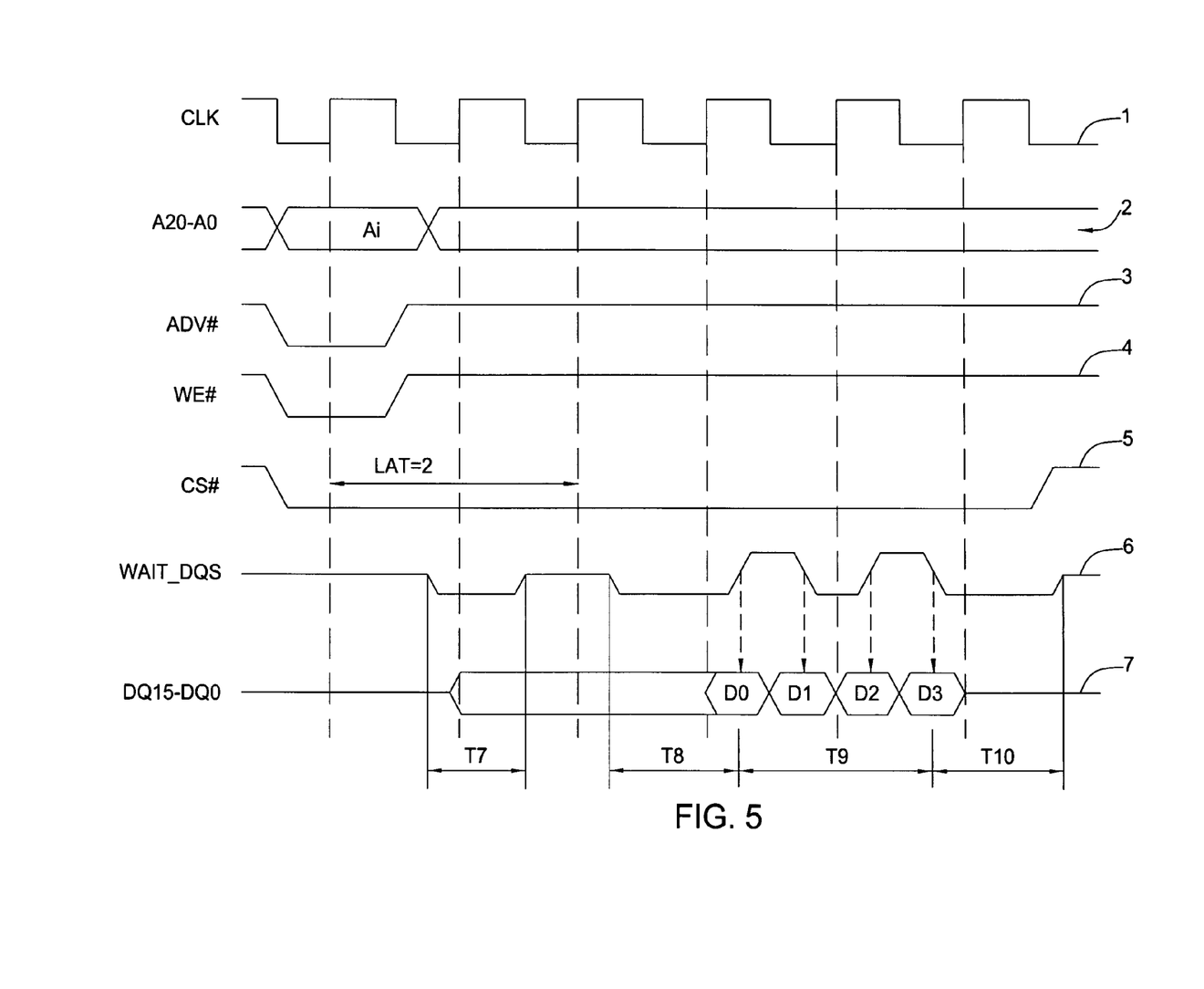
FIG. 5 depicts a series of illustrative timing diagrams of signals which might appear on corresponding transmission lines of system and data buses of the DDR Burst PSRAM device of FIG. 1 in Write cycle of a variable latency mode in one embodiment of the present invention.

FIG. 5 depicts a series of illustrative timing diagrams of signals which might appear on corresponding transmission lines of the system bus 106 and data bus 108 of the DDR burst PSRAM device of FIG. 1 that, in Write cycle, operates in a variable latency mode in one embodiment of the present invention. Specifically, FIG. 5 depicts the CLK, A20–A0, ADV#, WE#, CS#, WAIT_DQS, and DQ15–DQ0 signals (graphs 1–7, respectively) versus time. The WAIT_DQS signal comprises an indicating period T(7), a preamble period T(8), a data validation period T(9), and a postamble period T(10). During the indicating period T(7), the WAIT_DQS signal is initiated by the memory 104 or one of the component memories 200 (e.g., component memory $200_K$). Then, during the preamble period T(8), data validation period T(9), and postamble period T(10), the WAIT_DQS signal is initiated by the system controller 102. Prior to the indicating period T(7), the WAIT_DQS signal stays in the high-impedance state. During the indicating period T(7), the WAIT_DQS signal asserts logic low for a duration of one clock cycle starting two clock cycles prior to beginning of the preamble period T(8). Once the system controller 102 samples a low state of the WAIT_DQS signal, it starts, after 1 clock cycle, the preamble period, and the WAIT_DQS signal asserts logic low for a duration of one clock cycle on a clock signal. In this embodiment, the timing diagram of the WAIT_DQS signal and operations during the data validation period T(9) and postamble period T(10) are similar to the ones during the corresponding periods T(5) and T(6), respectively, described above in reference to FIG. 4.

Figure 6:
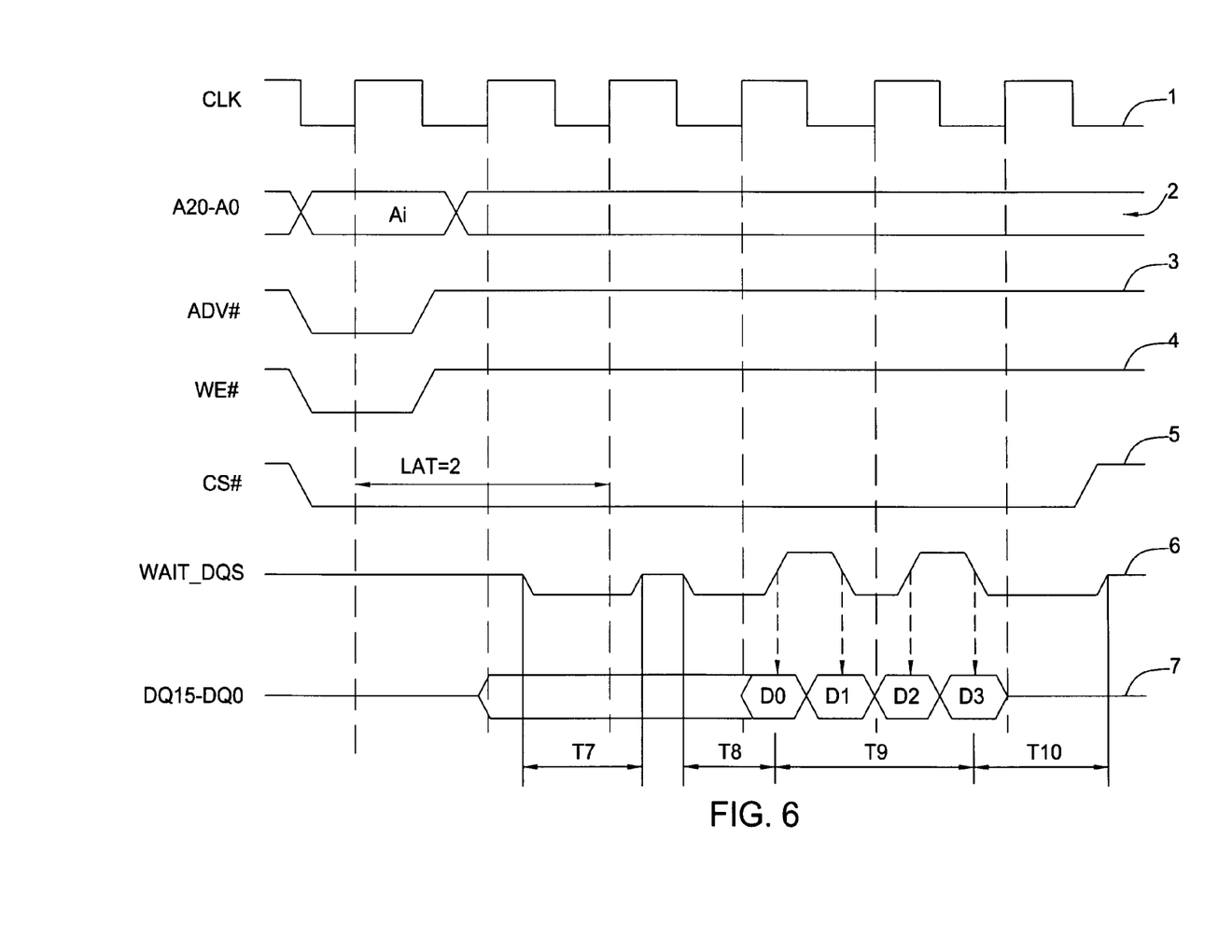
FIG. 6 depicts a series of illustrative timing diagrams of signals which might appear on corresponding transmission lines of system and data buses of the DDR Burst PSRAM device of FIG. 1 in Write cycle of a variable latency mode in another embodiment of the present invention.

FIG. 6 depicts a series of illustrative timing diagrams of signals which might appear on corresponding transmission lines of the system bus 106 and data bus 108 of the DDR burst PSRAM device of FIG. 1 that, in Write cycle, operates in a variable latency mode in another embodiment of the present invention. In this embodiment, the timing diagrams 1–7 and operations are similar to the ones discussed above in reference to FIG. 5, however, during the indicating period, the WAIT_DQS signal asserts logic low for a duration of one clock cycle starting one clock cycle prior to beginning of the preamble period T(8). As such, the memory 104 (or component memory 200$_K$) may be ready to data inputs D0–D3 approximately one clock cycle faster.

Figure 7:
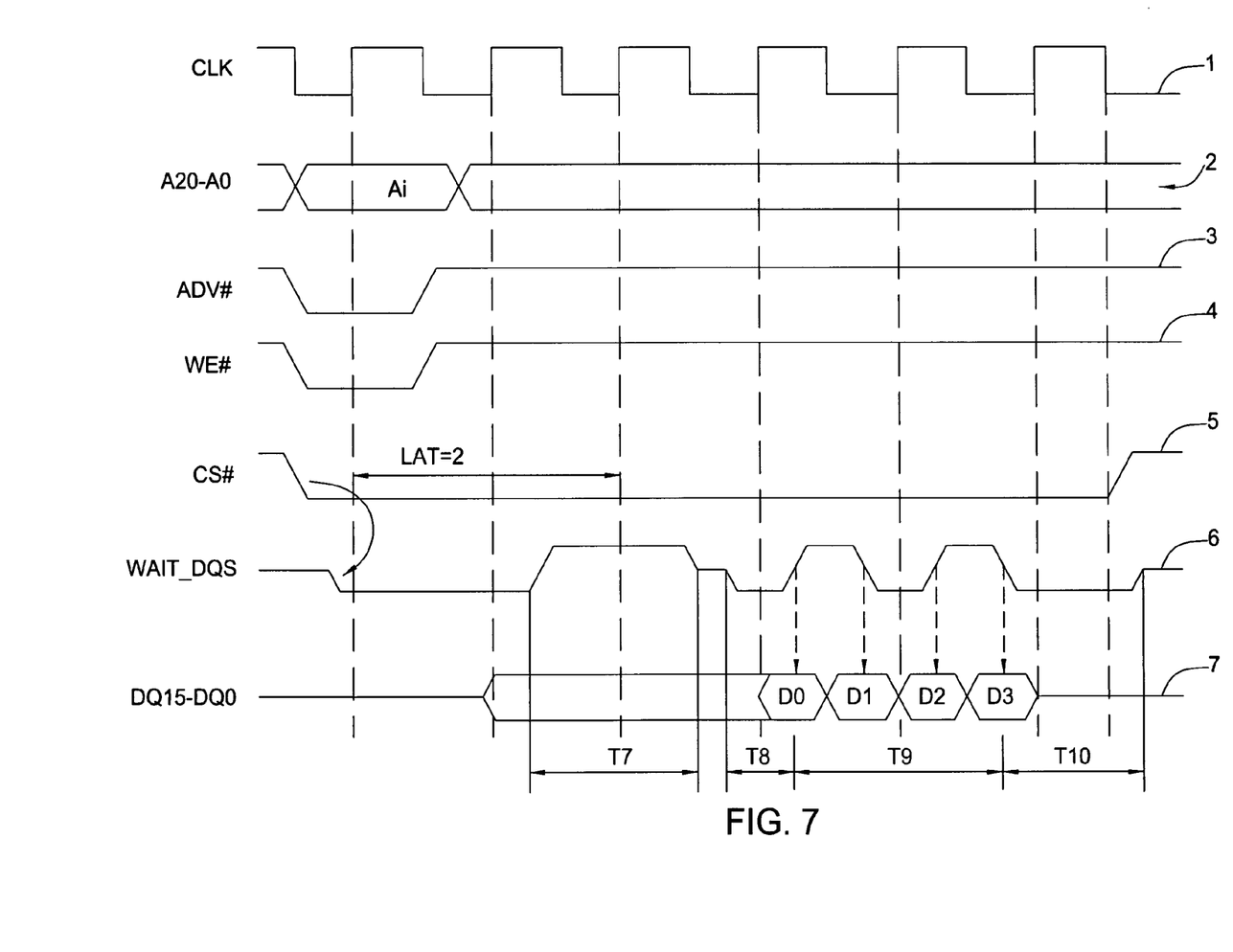
FIG. 7 depicts a series of illustrative timing diagrams of signals which might appear on corresponding transmission lines of system and data buses of the DDR Burst PSRAM device of FIG. 1 in Write cycle of a variable latency mode in yet another embodiment of the present invention.

FIG. 7 depicts a series of illustrative timing diagrams of signals which might appear on corresponding transmission lines of the system bus 106 and data bus 108 of the DDR burst PSRAM device of FIG. 1 that, in Write cycle, operates in a variable latency mode in yet another embodiment of the present invention. In this embodiment, the timing diagrams 1–7 and operations are similar to the ones discussed above in reference to FIG. 5, however, the WAIT_DQS signal asserts logic low when the chip select signal (CS#) is activated and asserts logic high when the memory 104 (or component memory 200$_K$) is ready to data input until beginning of the preamble period T(8).

Although the foregoing discussion referred to DDR burst PSRAM devices, other memory devices (e.g., DRAM devices) and integrated circuits can benefit from the invention.

While the foregoing is directed to embodiments of the present invention, other and further embodiments of the invention may be devised without departing from the basic scope thereof, and the scope thereof is determined by the claims that follow.

What is claimed is:

1. A method of operating a double data rate memory device, comprising:
   providing a bi-directional line in a system bus of the memory device to transmit a WAIT_DQS signal, the WAIT_DQS signal comprising functionality of (i) a WAIT signal indicating when valid data is present on a data bus in Read cycle and when a memory is ready to accept data in Write cycle, and (ii) a data strobe (DQS) signal serving as a timing signal for valid data; and
   propagating the WAIT_DQS signal in a bi-directional line in a system bus of the memory device, wherein the bi-directional line is coupled to the memory and a system controller, and wherein the WAIT_DQS signal has a WAIT state until completion of a refresh operation, in the event that a read cycle collides with an execution of the refresh operation.

2. The method of claim 1 wherein the memory comprises at least one component memory configured to initiate the WAIT_DQS signal and respond to the received WAIT_DQS signal.

3. The method of claim 1 wherein:
   the at least one component memory further comprises a terminal for transmitting the WAIT_DQS signal to the bi-directional line; and
   wherein the bi-directional line is electrically biased to facilitate a logic OR connection between the system controller and the at least one component memory.

4. The method of claim 1 wherein the memory device operates in a variable latency mode during a read cycle.

5. The method of claim 1 further comprising:
   initiating the WAIT_DQS signal in the memory.

6. The method of claim 5 wherein the WAIT_DQS signal further comprises:
   a preamble period;
   a data validation period; and
   a postamble period.

7. The method of claim 6 wherein, during the preamble period, the WAIT_DQS signal asserts logic low for a duration of one clock cycle on a clock signal that precedes the clock signal when the latency elapses or the memory is ready to output first valid data.

8. The method of claim 6 wherein, during the data validation period, the WAIT_DQS signal is edge-aligned to data output and toggles between logic low and logic high at every phase of data output to enable the system controller to strobe valid data.

9. The method of claim 6 wherein, during the postamble period, the WAIT_DQS signal asserts logic low for a duration of one clock cycle following output of last valid data.

10. The method of claim 1 wherein the memory device is capable of operating in a fixed or variable latency mode during a write cycle.

11. The method of claim 1 further comprising:
    initiating the WAIT_DQS signal in the system controller.

12. The method of claim 11 wherein the WAIT_DQS signal further comprises:
    a preamble period;
    a data validation period; and
    a postamble period.

13. The method of claim 12 wherein, during the preamble period, the WAIT_DQS signal asserts logic on a clock signal preceding the clock signal when the latency elapses or the memory is ready to ready to first valid data input.

14. The method of claim 12 wherein, during the data validation period, the WAIT_DQS signal is center-aligned to data input and toggles between logic low and logic high to enable the memory to strobe valid input data.

15. A system for controlling memory capable of operating in a double data rate mode comprising:
    a memory;
    a system controller;
    a data bus between the memory and the system controller; and
    a system bus between the memory and the system controller, the system bus having a bi-directional line for transmitting a WAIT_DQS signal that combines functionality of a data strobe signal and a wait signal indicating when valid data is present on the data bus during a read cycle and when the memory is ready to accept data during a write cycle, wherein the WAIT_DQS signal has a WAIT state until completion of a refresh ooeration, in the event that a read cycle collides with an execution of the refresh operation.

16. The system of claim 15 wherein, at different times, the WAIT_DQS signal is initiated by the memory or the system controller.

17. The system of claim 15 wherein the WAIT_DQS signal comprises functionality of (i) a WAIT signal indicating when valid data is present on a data bus in Read cycle and when the memory is ready to accept data in Write cycle, and (ii) a data strobe (DQS) signal indicating presence of valid data.

18. The system of claim 15 wherein the bi-directional line replaces at least one of a line propagating the DQS signal and a line propagating the WAIT signal.

19. The system of claim 15 wherein the WAIT_DQS signal is a 3-state digital signal having a logic low active state.

20. The system of claim 15 wherein the memory comprises at least one component memory configured to initiate the WAIT_DQS signal and respond to the received WAIT_DQS signal.

21. A memory device capable of operating in a variable latency mode comprising:
    one or more memory cells;
    one or more data lines for communicating with a memory controller via a data bus; and one or more control lines for communicating with the memory controller via a command bus, the one or more control lines comprising a bi-directional line for transmitting a WAIT_DQS signal to the controller and receiving a WAIT_DQS signal from the memory controller, wherein the WAIT_DQS signal combines functionality of a data strobe signal and a wait signal indicating when valid data is present on the data bus during a read cycle and when the memory device is ready to accept data during a write cycle, and wherein the WAIT_DQS signal has a WAIT state until completion of a refresh operation, in the event that a read cycle collides with an execution of the refresh operation.

22. The memory device of claim 21, wherein the bi-directional line is electrically biased to facilitate a logic OR connection between the system controller and at least one other memory device.

23. The memory device of claim 21 wherein the memory device operates in a variable latency mode in Read cycle.

24. The memory device of claim 23 wherein the WAIT_DQS signal further comprises:
a preamble period;
a data validation period; and
a postamble period.

25. The memory device of claim 24 wherein, during the preamble period, the memory device asserts the WAIT_DQS signal low for a duration of one clock cycle on a clock signal That precedes the clock signal when the latency elapses or the memory device is ready to output first valid data.

26. The memory device of claim 24 wherein, during the data validation period, the WAIT_DQS signal is edge-aligned to data output and toggles between logic low and logic high at every phase of data output to enable the memory controller to strobe valid data.

27. The memory device of claim 24 wherein, during the postamble period, the memory device asserts the WAIT_DQS signal low for a duration of one clock cycle following output of last valid data.

28. The memory device of claim 21 wherein the memory device operates in a fixed latency mode in Write cycle.

29. The memory device of claim 28 wherein the WAIT_DQS signal further comprises:
a preamble period;
a data validation period; and
a postamble period.

30. The memory device of claim 29 wherein, during the preamble period, the WAIT_DQS signal asserts logic on a clock signal preceding the clock signal when the latency elapses or the memory is ready to ready to first valid data input.

31. The memory device of claim 29 wherein, during the data validation period, the WAIT_DQS signal is center-aligned to data input and toggles between logic low and logic high to enable the memory to strobe valid input data.

32. The memory device of claim 29 wherein, during the postamble period, the WAIT_DQS signal asserts logic low for a duration of one clock cycle following input of last valid data.

33. The memory device of claim 21 wherein the memory device operates in a variable latency mode in Write cycle.

34. The memory device of claim 33 wherein the WAIT_DQS signal further comprises:
an indicating period;
a preamble period;
a data validation period; and
a postamble period.

35. The memory device of claim 34 configured in Write cycle to:
initiate the WAIT_DQS signal during the indicating period; and
receive the WAIT_DQS signal from the system controller during the preamble period, data validation period, and postamble period.

36. The memory device of claim 34 wherein, during the indicating period, the memory device asserts the WAIT_DQS signal low for a duration of one clock cycle starting two clock cycles prior to beginning of the preamble period.

37. The memory device of claim 34 wherein, during the indicating period, the memory device asserts the WAIT_DQS signal low for a duration of one clock cycle starting one clock cycle prior to beginning of the preamble period.

38. The memory device of claim 34 wherein, during the preamble period, the memory device asserts the WAIT_DQS signal low for a duration of one clock cycle on a clock signal that precedes the clock signal when the latency elapses or the memory device is ready to receive a first valid data input.

39. The memory device of claim 34 wherein, during the data validation period, the WAIT_DQS signal is center-aligned to data input and toggles between logic low and logic high to enable the memory to strobe valid input data.

40. The memory device of claim 34 wherein, during the postamble period, the memory device asserts the WAIT_DQS low for a duration of one clock cycle following input of last valid data.

* * * * *

UNITED STATES PATENT AND TRADEMARK OFFICE
CERTIFICATE OF CORRECTION

PATENT NO. : 6,996,016 B2 Page 1 of 1
APPLICATION NO. : 10/675549
DATED : February 7, 2006
INVENTOR(S) : Jong-Hoon Oh It is certified that error appears in the above-identified patent and that said Letters Patent is hereby corrected as shown below:

In Claim 15, at Column 8, Line 42, replace "ooeration" with --operation--.

In Claim 25, at Column 9, Line 28, replace "That" with --that--.

Signed and Sealed this

Twenty-ninth Day of May, 2007

JON W. DUDAS
*Director of the United States Patent and Trademark Office*